United States Patent [19]
Utsumi et al.

[11] Patent Number: 6,081,978
[45] Date of Patent: Jul. 4, 2000

[54] RESIN-ENCAPSULATED SEMICONDUCTOR DEVICE PRODUCING APPARATUS AND METHOD

[75] Inventors: Masaki Utsumi; Takahiro Matsuo; Hiroshi Hidaka, all of Osaka, Japan

[73] Assignee: Matsushita Electronics Corporation, Osaka, Japan

[21] Appl. No.: 09/452,458

[22] Filed: Dec. 2, 1999

[30] Foreign Application Priority Data

Mar. 31, 1999 [JP] Japan .................................. 11-090465

[51] Int. Cl.$^7$ .......................... H01L 21/00; H01L 21/64; H01L 21/44; H01L 21/48; H01L 21/50
[52] U.S. Cl. ......................... 29/25.01; 438/112; 438/113; 438/127; 264/272.13
[58] Field of Search ...................... 29/25.01; 264/272.13; 438/112, 113, 124, 126, 127, FOR 367, FOR 372, FOR 374, FOR 384, FOR 387

[56] References Cited

U.S. PATENT DOCUMENTS 5,336,272  8/1994  Tsutsumi et al. .
6,001,671  12/1999  Fjelstad .
6,033,933  3/2000  Hur .

FOREIGN PATENT DOCUMENTS 2-203544  8/1990  Japan .
9-82741   3/1997  Japan .

*Primary Examiner*—David E. Graybill
*Attorney, Agent, or Firm*—Eric J. Robinson; Nixon Peabody LLP

[57] ABSTRACT

A resin-encapsulated semiconductor device producing apparatus includes resin encapsulating part for encapsulating, into a unitary structure, a semiconductor-chip holding zone of a lead frame or a substrate which holds a semiconductor chip, this encapsulation being made with an encapsulating resin material. The resin encapsulating part has first and second holding members for holding the lead frame or the substrate such that the first and second holding members are opposite to each other through the lead frame or the substrate. At least one of the first and second holding members has a housing concave formed opposite to the holding zone, the housing concave being capable of housing the encapsulating resin material. A resin thickness regulating member for regulating the thickness of the encapsulating resin material is removably disposed on the bottom of the housing concave.

16 Claims, 6 Drawing Sheets

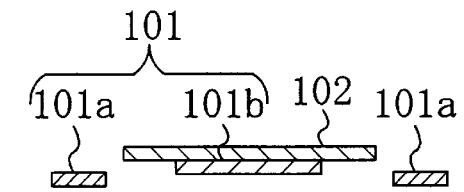
Fig. 10(a) PRIOR ART
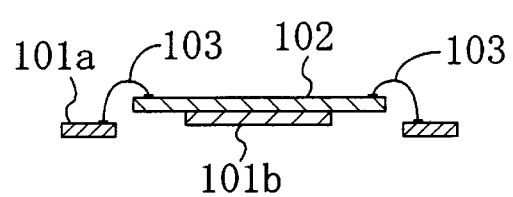
Fig. 10(b) PRIOR ART
Fig. 10(c) PRIOR ART
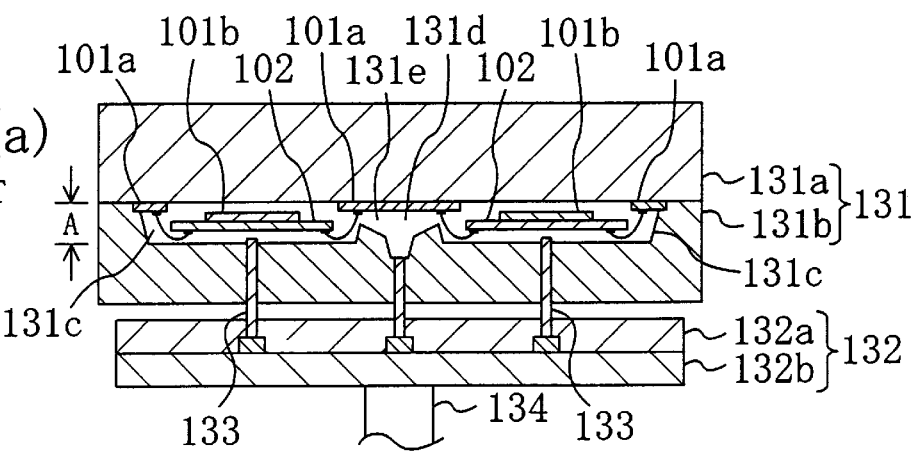
Fig. 11(a) PRIOR ART
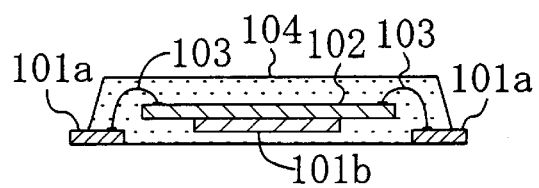
Fig. 11(b) PRIOR ART
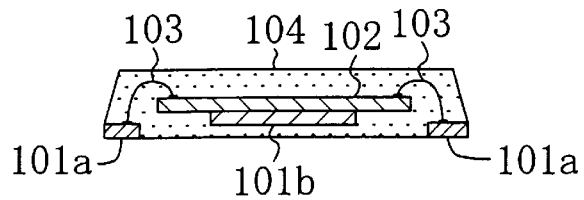
Fig. 11(c) PRIOR ART

RESIN-ENCAPSULATED SEMICONDUCTOR DEVICE PRODUCING APPARATUS AND METHOD

BACKGROUND OF THE INVENTION

The present invention relates to apparatus for and method of producing a resin-encapsulated semiconductor device by encapsulating, with an encapsulating resin material, a lead frame or a substrate which holds a semiconductor chip.

To accommodate the miniaturization of electronic devices, it is increasingly required to mount semiconductor elements with high density. To meet such demand, semiconductor devices are further miniaturized and thinner.

With reference to attached drawings, the following description will discuss a conventional resin-encapsulated semiconductor device producing method of hermetically encapsulating a semiconductor chip with a mold resin material.

FIG. 10(a) to FIG. 10(a) and FIG. 11(a) to FIG. 11(c) illustrate a resin-encapsulated semiconductor device producing method of prior art. FIG. 10(a) to FIG. 10(c) show a semiconductor device in section at a die bonding step and a wire bonding step, and FIG. 11(a) to FIG. 11(c) show a semiconductor device in section at a resin encapsulating step and an external electrode forming step.

As shown in FIG. 10(a), there is prepared a lead frame 101 having an inner lead portion 101a and a die pad portion 101b. The die pad portion 101b is held by a hanging lead (not shown). The hanging lead has a depressed portion which sets the die pad portion 101b at a position higher than the top of the inner lead portion 101a.

At a die bonding step in FIG. 10(b), the die pad portion 101b of the lead frame 101 is bonded to a semiconductor chip 102 with adhesives or the like.

At a wire bonding step in FIG. 10(a), the inner lead portion 101a of the lead frame 101 is electrically connected to the semiconductor chip 102 bonded to the die pad portion 101b with metallic fine lines 103.

Such a lead frame 101 and semiconductor chips 102 wire-bonded thereto are held by an encapsulating mold unit 131 of a semiconductor device producing apparatus as shown in FIG. 11(a).

The encapsulating mold unit 131 of the producing apparatus comprises an upper mold 131a and a lower mold 131b. The upper mold 131a is arranged to determine the shape of the resin material at the bottom sides of the die pad portions 101b of the lead frame 101. The lower mold 131b has a plurality of cavities 131a for determining the shape of the resin material at the top sides of the semiconductor chips 102 in the lead frame 101.

An ejector plate unit 132 and a plurality of ejector pins 133 are disposed at the encapsulating mold unit 131. The ejector plate unit 132 comprises an upper ejector plate 132a and a lower ejector plate 132b, these plates being disposed under the lower mold 131b. The ejector pins 133 vertically pass through the lower mold 131b and are vertically movable. In the ejector pins 133, the one ends project from the bottoms of the cavities 131c, the other ends are secured to the upper ejector plate 132a, and the lateral sides come in contact with the lower mold 131b. Disposed at the lower ejector plate 132b is an ejector rod 134 which is connected to the bottom of the lower ejector plate 132b for moving the ejector plate unit 132 and the ejector pins 133 in the opening direction of the cavities 131c.

A runner 131d is disposed between adjacent cavities 131c and communicates with gates 131e each of which is disposed, as a resin material inlet port, for each of the cavities 131c.

A molten resin material is injected into the cavities 131c through the runner 131d and the gates 131e to encapsulate, into a unitary structure, the inner lead portion 101a and the die pad portions 101b of the lead frame 101, and the semiconductor chips 102. Then, the encapsulated structure is subjected to a predetermined heating treatment to harden the resin material.

Then, the upper mold 131a is separated from the lower mold 131b, and the ejector rod 134 is then upwardly moved to push out a molded article made of hardened resin material through both the ejector plate unit 132 connected to the ejector rod 134, and the ejector pins 133.

Generally, one to about five ejector pins 133 are disposed for one molded article. The number and positions of the ejector pins 133 are determined according to the sizes of a molded article particularly to minimize the stress applied to the semiconductor chips 102 inside of the molded article at the time when the molded article is pushed out.

As shown in FIG. 11(b), an encapsulated resin body 104 is obtained by cutting the molded article at the runner 131d and the gates 131e. For simplification sake, only one encapsulated resin body 104 is shown in FIG. 11(b). However, since the lead frame 101 is rectangular, a plurality of encapsulated resin bodies 104 can be obtained.

Then, as shown in FIG. 11(c), there are cut and removed those portions of the inner lead portion 101a of the lead frame 101 which project from the encapsulated resin body 104. Thus, the end surface of the inner lead portion 101a is substantially flush with the lateral sides of the encapsulated resin body 104.

However, such conventional apparatus for and method of producing a resin-encapsulated semiconductor device is disadvantageous in the following points.

When the encapsulated resin body 104 thickness determined by the depth A of the cavities 131c shown in FIG. 11(a), is to be changed according to the shape of the encapsulated resin body 104 as in QFP (quad flat package) or TQFP (thin quad flat package), it is required to newly produce an encapsulating mold unit 131 corresponding to the changed thickness of the encapsulated resin body 104. The production of a new encapsulating mold unit 131 takes much time and cost. This constitutes a first problem that when the encapsulated resin body 104 of a resin-encapsulated semiconductor device is changed in thickness, a large number of man-hours is required for mass production of such encapsulated resin body 104 changed in thickness. Further, when there are prepared a variety of encapsulating mold units 131 corresponding to different thicknesses of encapsulated resin bodies 104, this not only takes a large number of man-hours for maintaining and managing such encapsulating mold units 131, but also requires a space for storing such encapsulating mold units 131.

Moreover, a resin-encapsulated molded article is pushed out by the ejector pins 133 disposed at the encapsulating mold unit 131. As mentioned earlier, one to five ejector pins 133 are used for one molded article. Accordingly, at the time of pushing-out, stress is concentrated on those portions of the molded article which come in contact with the ejector pins 133. This constitutes a second problem. In the worst case, a semiconductor element of a semiconductor chip 102 inside of a molded article might be broken due to the stress at the time when the molded article is pushed out. Further, the ejector pins 133 of prior art project to a height of about 0.1 mm to about 0.2 mm from the bottom of the cavities 131c. Accordingly, at the time of resin-encapsulation, those portions of the ejector pins 133 projecting into the cavities 131c prevent the injected resin material from freely flowing, thus producing a flow resistance. This involves the likelihood that the resin material does not flow uniformly. Also, after molding, the traces of the ejector pins are left on the molded article. This restricts that surface zone of the encapsulated resin body 104 on which a product No. and/or a secret No. are to be marked. This decreases the degree of freedom for marking.

SUMMARY OF THE INVENTION

In view of these problems of prior art, it is an object of the present invention to readily and rapidly comply with change in design as to the thickness, the surface state, the surface shape and the like of the encapsulated resin body of a resin-encapsulated semiconductor device.

To achieve the object above-mentioned, the present invention is arranged such that a resin thickness regulating member is removably disposed on the bottom of a housing concave (cavity) which determines the shape of an encapsulating resin material, this housing concave being formed in a resin encapsulating mold unit.

More specifically, the present invention provides a resin-encapsulated semiconductor device producing apparatus comprising resin encapsulating means for encapsulating, into a unitary structure, a semiconductor-chip holding zone of a lead frame or a substrate which holds a semiconductor chip, such encapsulation being made with an encapsulating resin material, the resin encapsulating means comprising first and second holding members for holding the lead frame or the substrate such that the first and second holding members are opposite to each other through the lead frame and the substrate, at least one of the first and second holding members having a housing concave formed opposite to the holding zone, the housing concave being capable of housing the encapsulating resin material, and a resin thickness regulating member for regulating the thickness of the encapsulating resin material being removably disposed on the bottom of the housing concave.

According to this resin-encapsulated semiconductor device producing apparatus, at least one of the first and second holding members has a housing concave capable of housing an encapsulating resin material, and the resin thickness regulating member for regulating the thickness of the encapsulating resin material is disposed on the bottom of the housing concave. Accordingly, when the thickness of the encapsulating resin material is to be changed, there can be placed, on the housing concave, a resin thickness regulating member by which there can be obtained an encapsulating resin material having the changed thickness. This can readily and rapidly deal with a change in design.

The resin-encapsulated semiconductor device producing apparatus of the present invention is preferably arranged such that the resin thickness regulating member comprises a single plate member. According to the arrangement above-mentioned, when there are previously prepared a plurality of resin thickness regulating members respectively different in thickness, mere replacement of a resin thickness regulating member can readily and rapidly deal with a change in design. Further, that surface of the resin thickness regulating member opposite to its surface at the side of the housing concave bottom, comes in direct contact with the encapsulating resin material. Accordingly, when there are previously prepared a plurality of resin thickness regulating members respectively different in the states or shapes of their surfaces which come in direct contact with the encapsulating resin material, the state or shape of the surface of the encapsulating resin material can readily be changed.

The resin-encapsulated semiconductor device producing apparatus of the present invention is preferably arranged such that the resin thickness regulating member comprises a laminated body in which a plurality of plate members are detachably laminated. According to the arrangement above-mentioned, even though the encapsulating resin material is to be changed in thickness, such a change in design can readily be coped with by merely changing the thickness or the number of plate members in order to obtain an encapsulating resin material having the changed thickness. Further, when the thickness of the resin thickness regulating member is changed by placing or removing a plate member, out of a plurality of plate members, which does not come in direct contact with the encapsulating resin material, the same plate member always comes in direct contact with the encapsulating resin material. Accordingly, even though the encapsulating resin material is changed in thickness, the state or shape of the surface of the encapsulating resin material remains unchanged. This can produce encapsulating resin materials with their surface states and surface shapes always constant.

The resin-encapsulated semiconductor device producing apparatus of the present invention is preferably arranged such that the lead frame or the substrate holds a plurality of semiconductor chips, and that both the housing concave and the resin thickness regulating member are disposed for each of the semiconductor chip. According to the arrangement above-mentioned, it is possible to change each encapsulating resin material thickness for each semiconductor chip.

The resin-encapsulated semiconductor device producing apparatus of the present invention is preferably arranged such that the lead frame or the substrate holds a plurality of semiconductor chips, and that the housing concave is disposed so as to house all the semiconductor chips. According to the arrangement above-mentioned, the thickness of the encapsulating resin material can be changed collectively for a plurality of semiconductor chips.

The present invention provides a first resin-encapsulated semiconductor device producing method comprising: a die bonding step of getting a semiconductor chip held by a lead frame or a substrate at its predetermined zone; and a resin encapsulating step of (i) holding the lead frame or the substrate in a resin encapsulating mold unit having a housing concave capable of housing an encapsulating resin material, such that the semiconductor chip is opposite to the housing concave, (ii) then injecting an encapsulating resin material into the housing concave and (iii) encapsulating the semiconductor chip with the injected encapsulating resin material, this resin encapsulating step having a step of conducting a resin encapsulation with the use of a resin thickness regulating member which is removably disposed on the bottom of the housing concave such that the thickness of the injected encapsulating resin material is regulated.

According to the first resin-encapsulated semiconductor device producing method of the present invention, at the resin encapsulating step, resin encapsulation is conducted using the resin thickness regulating member which is removably disposed on the bottom of the housing concave of the encapsulating mold unit such that the thickness of the injected encapsulating resin material is regulated. Accordingly, even when the encapsulating resin material is to be changed in thickness, such a design change can readily be achieved by using a resin thickness regulating member by which there can be obtained an encapsulating resin material having the changed thickness.

The first resin-encapsulated semiconductor device producing method of the present invention is preferably arranged such that the resin encapsulating step comprises a step of regulating the state of that surface of the resin thickness regulating member which comes in contact with an encapsulating resin material which is injected. According to the arrangement above-mentioned, because the resin thickness regulating member is removably disposed on the bottom of the housing concave, it is possible to readily optimize that surface state of the encapsulating resin material which greatly controls the mold-release condition or the marking condition, when the design or type of semiconductor devices to be produced is to be changed.

The first resin-encapsulated semiconductor device producing method of the present invention is preferably arranged such that the resin encapsulating step comprises a step of regulating the shape of that surface of the resin thickness regulating member which comes in contact with an encapsulating resin material which is injected. According to the arrangement above-mentioned, because the resin thickness regulating member is removably disposed on the bottom of the housing concave, it is possible to readily cope with a change in type of semiconductor devices to be produced. Further, when the resin thickness regulating member has such a surface shape as to minimize the amount of the resin portion which will result in the unnecessary portion of the hardened encapsulating resin material, this reduces not only the time required for the dividing or shaping step, but also the amount of wear of the dividing jig or the like.

Preferably, the first resin-encapsulated semiconductor device producing method of the present invention further comprises, after the resin encapsulating step, a step of (i) hardening the encapsulating resin material which encapsulates the semiconductor chip, and (ii) then moving the resin thickness regulating member in the opening direction of the housing concave, thereby to take out the hardened encapsulating resin material from the housing concave. According to the arrangement above-mentioned, the hardened encapsulating resin material comes in surface contact with the resin thickness regulating member and no stress is therefore partially exerted to the encapsulating resin material. This eliminates the danger of an element of the semiconductor chip being damaged. Further, because no ejector pin is used for mold release, no pin trace is left on the surface of the resin material. This increases the degree of marking freedom for the hardened resin material.

Preferably, the first resin-encapsulated semiconductor device producing method of the present invention further comprises, after the resin encapsulating step, a step of (i) hardening the encapsulating resin material which encapsulates the semiconductor chip, (ii) then applying a pressure to that unnecessary portion of the lead frame or the substrate which projects from the hardened encapsulating resin material, the pressure being applied in the opening direction of the housing concave, and (iii) moving the hardened encapsulating resin material in the opening direction of the housing concave, thereby to take out the hardened encapsulating resin material from the housing concave. According to the arrangement above-mentioned, no stress is applied in the vicinity of the semiconductor chip encapsulated in the encapsulating resin material. This eliminates the danger of an element of the semiconductor chip being damaged. Further, when the unnecessary portion of the lead frame or the substrate is removed, no pin trace is left on the surf ace of the hardened resin material. This increases the degree of marking freedom for the hardened resin material.

Preferably, the first resin-encapsulated semiconductor device producing method of the present invention further comprises, after the resin encapsulating step, a step of (i) hardening the encapsulating resin material which encapsulates the semiconductor chip, (ii) then applying a pressure to the unnecessary portion of the hardened encapsulating resin material in the opening direction of the housing concave, and (iii) moving the hardened encapsulating resin material in the opening direction of the housing concave, thereby to take out the hardened encapsulating resin material from the housing concave. According to the arrangement above-mentioned, no stress is applied in the vicinity of the semiconductor chip encapsulated in the encapsulating resin material. Further, when there is removed that portion of the encapsulating resin material to which the pressure is applied, no pin trace is left on the surface of the hardened resin material. This increases the degree of marking freedom for the hardened resin material.

Preferably, the first resin-encapsulated semiconductor device producing method of the present invention further comprises, after the resin encapsulating step, a shaping step of (i) hardening the encapsulating resin material which encapsulates the semiconductor chip, and (ii) then removing the unnecessary portion of the hardened encapsulating resin material, thereby to arrange the shape of the hardened encapsulating resin material. When resin encapsulation is conducted with the use of any of a variety of resin thickness regulating members different in thickness or shape, a gap may be produced at a corner of the bottom of the housing concave of the encapsulating mold unit, and the corner gap may be filled with a molten encapsulating resin material. This involves the likelihood that a burr is produced at the periphery of the hardened resin material. According to the arrangement above-mentioned, however, the unnecessary portion of the hardened encapsulating resin material is cut and shaped. Accordingly, even though any of resin thickness regulating members having a variety of shapes is used, no inconvenience is given to a produced semiconductor device itself.

The first resin-encapsulated semiconductor device producing method of the present invention is preferably arranged such that the shaping step comprises a step of cutting, with a dicing saw, the boundary between the necessary portion and the unnecessary portion of the hardened encapsulating resin material. The arrangement above-mentioned can optimize a variety of cutting conditions of the dicing saw such as the blade material, the number of cutting rotations, the feed speed, the depth of cut and the like. This results in improvement in semiconductor device.

The first resin-encapsulated semiconductor device producing method of the present invention is preferably arranged such that the shaping step comprises a step of cutting, with a mold punch unit, the boundary between the necessary portion and the unnecessary portion of the hardened encapsulating resin material. According to the arrangement above-mentioned, a plurality of semiconductor devices can simultaneously be divided into each device. This results in shortened lead time.

The present invention provides a second resin-encapsulated semiconductor device producing method comprising: a die bonding step of getting a semiconductor chip held by a lead frame or a substrate at its predetermined zone; a resin encapsulating step of (i) holding the lead frame or the substrate in a resin encapsulating mold unit having a housing concave capable of housing an encapsulating resin material, such that the semiconductor chip is opposite to the housing concave, (ii) then injecting an encapsulating resin material into the housing concave and (iii) encapsulating the semiconductor chip with the injected encapsulating resin material; and a step of (i) hardening the encapsulating resin material which encapsulates the semiconductor chip, (ii) then applying a pressure to that unnecessary portion of the lead frame or the substrate which projects from the hardened encapsulating resin material, the pressure being applied in the opening direction of the housing concave, and (iii) moving the hardened encapsulating resin material in the opening direction of the housing concave, thereby to take out the hardened encapsulating resin material from the housing concave.

The present invention provides a third resin-encapsulated semiconductor device producing method comprising: a die bonding step of getting a semiconductor chip held by a lead frame or a substrate at its predetermined zone; a resin encapsulating step of (i) holding the lead frame or the substrate in a resin encapsulating mold unit having a housing concave capable of housing an encapsulating resin material, such that the semiconductor chip is opposite to the housing concave, (ii) then injecting an encapsulating resin material into the housing concave and (iii) encapsulating the semiconductor chip with the injected encapsulating resin material; and a step of (i) hardening the encapsulating resin material which encapsulates the semiconductor chip, (ii) then applying a pressure to the unnecessary portion of the hardened encapsulating resin material in the opening direction of the housing concave, and (iii) moving the hardened encapsulating resin material in the opening direction of the housing concave, thereby to take out the hardened encapsulating resin material from the housing concave.

According to each of the second and third resin-encapsulated semiconductor device producing methods of the present invention, when the hardened encapsulating resin material is removed from the encapsulating mold unit, no stress is applied in the vicinity of the semiconductor chip encapsulated in the resin material. This eliminates the danger of an element of the semiconductor chip being damaged. Further, when the unnecessary portion of the lead frame or the substrate is removed, no pin trace is left on the surface of the hardened resin material. This increases the degree of marking freedom for the hardened resin material.

BRIEF DESCRIPTION OF THE DRAWINGS

FIG. 10(a) to FIG. 10(c) are structural section views illustrating steps of a resin-encapsulated semiconductor device producing method of prior art; and FIG. 11(a) to FIG. 11(c) are structural section views illustrating steps of the resin-encapsulated semiconductor device producing method of prior art.

DETAILED DESCRIPTION OF THE INVENTION (EMBODIMENT 1)

The following description will discuss a first embodiment of the present invention with reference to attached drawings.

Figure 1A:
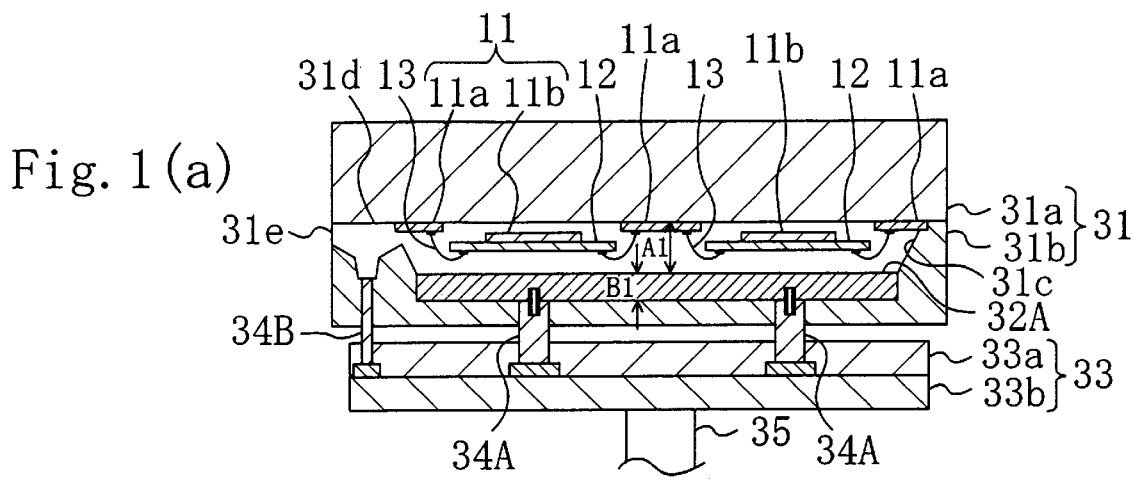
FIG. 1(a) to FIG. 1(c) are partial structural section views of resin encapsulating mold units of resin-encapsulated semiconductor device producing apparatus according to a first embodiment of the present invention, illustrating the arrangements in which there are disposed resin thickness regulating members different in thickness from one another.
Figure 1B:
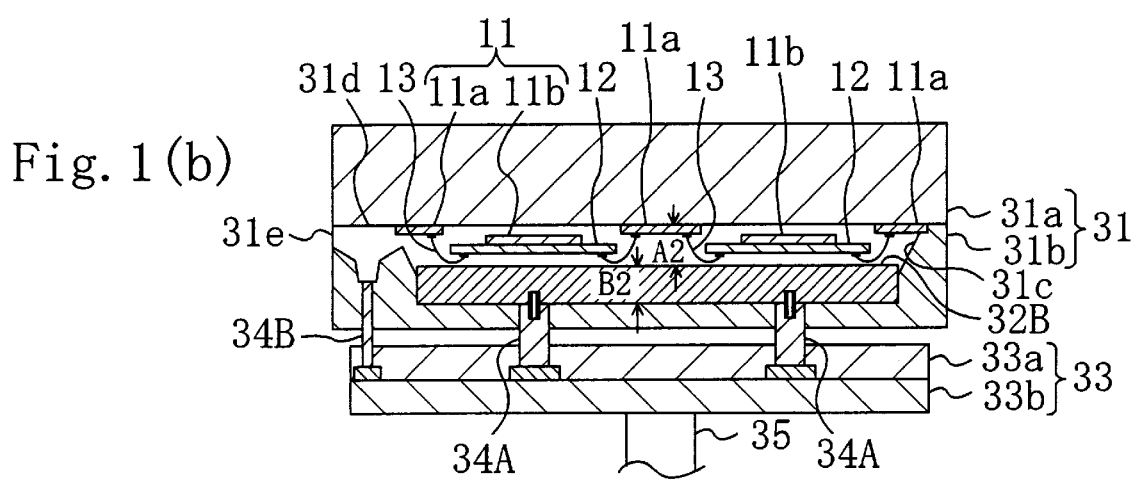
Figure 1C:
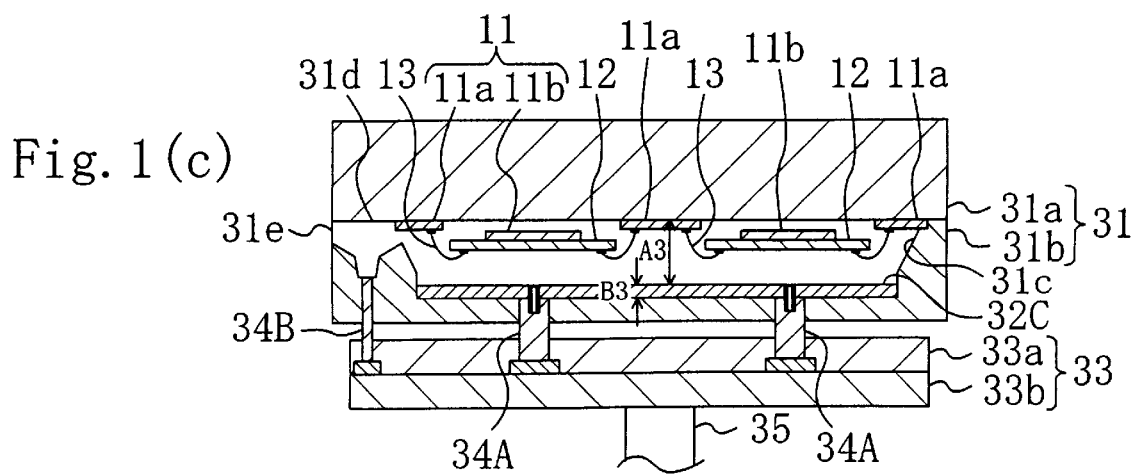

FIG. 1(a) to FIG. 1(c) are partial structural section views of resin encapsulating mold units of resin-encapsulated semiconductor device producing apparatus according to the first embodiment of the present invention, illustrating the arrangements in which there are disposed resin thickness regulating members respectively different in thickness.

As shown in FIG. 1(a), the resin-encapsulated semiconductor device producing apparatus according to the first embodiment comprises an encapsulating mold unit 31 serving as resin encapsulating means. The encapsulating mold unit 31 comprises an upper mold 31a serving as a first holding member, a lower mold 31b serving as a second holding member, and removal blocks 32A each serving as a resin thickness regulating member. The upper mold 31a is arranged to determine the shape of the resin material at the bottom sides of die pad portions 11b of a lead frame 11. The lower mold 31b has a plurality of cavities 31c each serving as a housing concave portion for determining the shape of the resin material at the top sides of semiconductor chips 12 in the lead frame 11. Each removal block 32A is removably disposed in close contact with the bottom surface of each cavity 31c of the lower mold 31b. For convenience sake, FIG. 1(a) shows only one cavity 31c out of a plurality of cavities 31c.

For each cavity 31c, an ejector plate unit 33, a plurality of block ejectors 34A, and an ejector pin 34B are disposed at the encapsulating mold unit 31. It is noted that one ejector pin 34B is disposed between adjacent cavities 31a. The ejector plate unit 33 comprises an upper ejector plate 33a and a lower ejector plate 33b, these plates being disposed under the lower mold 31b. The block ejectors 34A vertically pass through the lower mold 31b and are vertically movable. In the block ejectors 34A, one ends are connected to the bottom of the removal block 32A, the other ends are secured to the upper ejector plate 33, and the lateral sides come in contact with the lower mold 31b. The ejector pin 34B vertically passes through the bottom of the lower mold 31b and is vertically movable. In the ejector pin 34B, one end is positioned at the bottom of a runner 31d, the other end is secured to the upper ejector plate 33 and the lateral side comes in contact with the lower mold 31b. Disposed at the lower ejector plate 33b is an ejector rod 35 which is connected to the bottom of the lower ejector plate 33b for moving the ejector plate unit 33, the block ejectors 34A and the ejector pin 34B in the opening direction of the cavity 31c.

A runner 31d is disposed between adjacent cavities 31c and communicates with a pot (not shown) which houses a molten resin material. The runner 31d communicates with a gate 31e which is disposed, as a resin material inlet port, for each of the cavities 31c. Accordingly, although not shown, the encapsulating mold unit 31 according to the first embodiment comprises, at the opposite side of the cavity 31c with respect to the ejector pin 34B, at least one set of another cavity 31c communicating with this runner 31d and another ejector plate unit disposed under this another cavity 31c.

At a resin encapsulating step in FIG. 1(a), the lead frame 11 has a plurality of inner lead portions 11a and a plurality of die pad portions 11b. A plurality of semiconductor chips 12 respectively bonded to the die pad portions 11b, are electrically connected to the inner lead portions 11a with metallic fine lines 13. The lead frame 11 after subjected to the die bonding step, is held by and between the upper mold 31a and the lower mold 31b with the die pad portions 11b contained in the cavity 31c.

FIG. 1(b) shows an encapsulating mold unit 31 using removal blocks 32B each having a thickness B2 greater than the thickness B1 of each removal block 32A in FIG. 1(a). FIG. 1(c) shows an encapsulating mold unit 31 using removal blocks 32C each having a thickness B3 smaller than the thickness B1 of each removal block 32A in FIG. 1(a). In each of FIG. 1(b) and FIG. 1(c), like parts are designated by like reference numerals used in FIG. 1(a) and the description thereof is therefore omitted.

According to the first embodiment having the arrangement above-mentioned, when encapsulating the lead frame 11 and semiconductor chips 12 with resin, it is possible to optionally change the depth of the cavity 31c which determines the shape of that zone of the encapsulating resin material at the sides of the semiconductor chips 12, by selectively using one of the removal blocks 32A, 32B, 32C which is removably disposed in close contact with the bottom of the cavity 31c.

For example, the thickness B2 of the removal block 32B in FIG. 1(b) is greater than the thickness B1 of the removal block 32A in FIG. 1(a). Accordingly, the substantial depth A2 of the cavity 31c in FIG. 1(b) is smaller than the substantial depth A1 of the cavity 31c in FIG. 1(a). On the contrary, the substantial depth A3 of the cavity 31c in FIG. 1(c) is greater than the substantial depth A1 of the cavity 31c in FIG. 1(a). Accordingly, when a plurality of types of removal blocks 32A, 32B, 32C respectively different in thickness are previously prepared, it is not required to prepare a new encapsulating mold unit 31 to cope with design change such as a change in the thickness of an encapsulating resin material. This readily and rapidly complies with a change in design, yet assuring the performance and quality of resin-encapsulated semiconductor devices as in the prior art. This results in remarkable reduction in time and cost required for renewing the encapsulating mold unit 31 according to a design change. Thus, the semiconductor device production cost can be lowered.

In the first embodiment, the description has been made of an one-side encapsulation in which the cavities 31c are formed only in the lower mold 31b. However, it is a matter of course that when cavities 31c are formed also in the upper mold 31a, the encapsulating mold unit 31 can be applied to a both-side encapsulation such as QFP.

Figure 2:
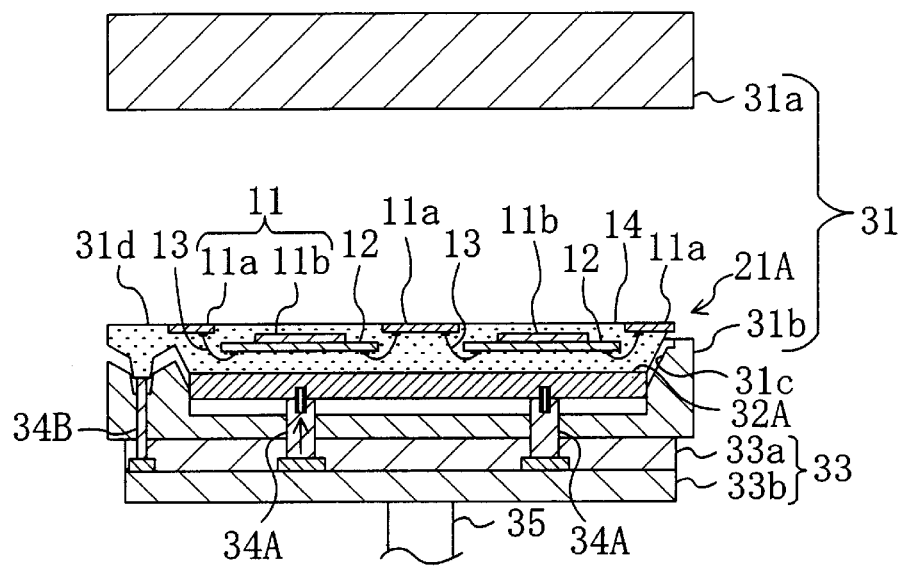
FIG. 2 is a partial structural section view of a resin encapsulating mold unit, at a taking-out (mold release) step, of the resin-encapsulated semiconductor device producing apparatus according to the first embodiment of the present invention.

FIG. 2 shows a mold release step at which a molded article 21A obtained after an encapsulating resin material injected into the cavity 31c has been hardened, is to be removed from the cavity 31c. In FIG. 2, an encapsulated resin body 14 is made of the hardened encapsulating resin material. In FIG. 2, like parts are designated by like reference numerals used in FIG. 1(a) and the description thereof is therefore omitted.

As shown in FIG. 2, the upper mold 31a of the encapsulating mold unit 31 is removed from the lower mold 31b, and the ejector rod 35 is then moved in the opening direction of the cavity 31c. This causes the removal block 32A to be pushed in the opening direction of the cavity 31c through the block ejectors 34A. As a result, the molded article 21A is taken out from the cavity 31c.

In the manner above-mentioned, ejector pins are not used for pushing out the molded article 21A itself at the mold-release time unlike in the prior art. Thus, at the time of mold release, no pressure acts on those zones of the molded article 21A which would come in contact with the ejector pins in the prior art. Accordingly, no stress is exerted to a semiconductor element of a semiconductor chip 12 inside of the encapsulated resin body 14. This prevents the semiconductor elements from being damaged.

According to the first embodiment, the ejector pin 34B for pushing out the runner 31d is disposed at the ejector plate unit 33 as shown in FIG. 1(a). However, when the area of the molded article 21A at the side of the semiconductor chips 12 is relatively large, the molded article 21A can be taken out from the lower mold 31b only by the removal block 32A.

Further, there are not left, on the molded article 21A, traces which are formed in the prior art when the ejector pins come in contact. This does not restrict the marking area of the encapsulated resin body 14. This results in increase in the degree of freedom for marking.

Figure 3A:
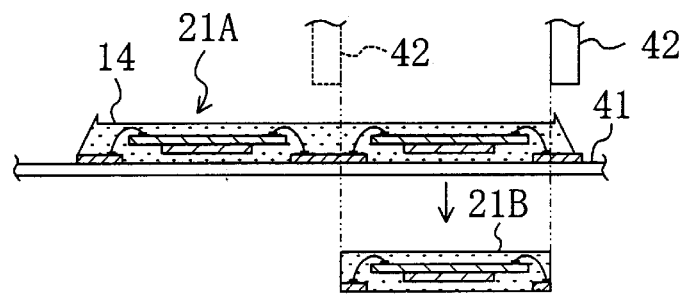
FIG. 3(a) and FIG. 3(b) are structural section views of semiconductor devices, at a shaping step, produced with the use of the resin-encapsulated semiconductor device producing apparatus according to the first embodiment of the present invention.
Figure 3B:
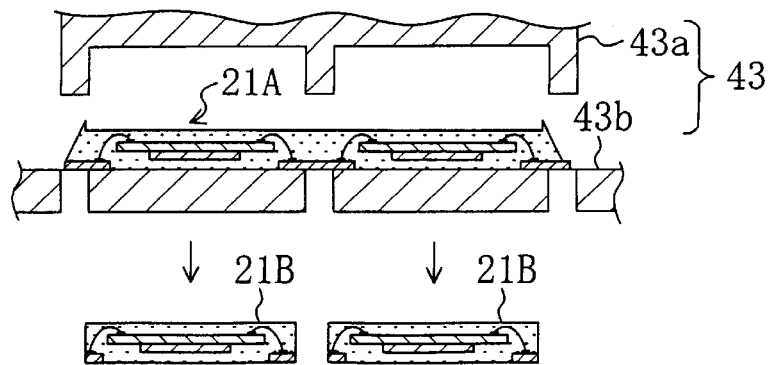

Each of FIG. 3(a) and FIG. 3(b) shows a shaping step at which there are removed the unnecessary portions of the encapsulated resin body 14 from the molded article 21A according to the first embodiment. FIG.3(a)shows a process using a dicing saw 42 as a cutting jig, while FIG. 3(b) shows a process using a mold punch unit 43 as a cutting jig. As shown in FIG. 3(a), the molded article 21A taken out from the encapsulating mold unit 31 is placed on a UV sheet 41. Then, each unnecessary portion of the molded article 21A is cut with the use of the dicing saw 42 to be used for cutting the semiconductor chips 12. Thus, individual semiconductor devices 21B are formed as cut from the molded article 21A comprising a plurality of semiconductor chips 12. When the dicing saw 42 is used as a cutting jig, it is possible to combine a variety of cutting conditions of the dicing saw 42 such as blade material, the number of cutting rotations, feed speed, the depth of cut and the like. It is therefore possible to optimize the cutting conditions to securely produce the semiconductor devices 21B of high quality.

Thus, each resin-encapsulated semiconductor device according to the first embodiment is arranged such that the inner lead portion 11a of the lead frame 11 projects from the bottom of the encapsulated resin body 14 and the inner lead portion 11a itself serves as an outer terminal.

As shown in FIG. 3(b), there may be used the mold punch unit 43 comprising an upper mold punch 43a having punching portions, and a lower mold punch 43b provided in the positions opposite to the punching portions of the upper mold punch 43a with openings to be fitted thereto. More specifically, the molded article 21A is placed on the lower mold punch 43b such that the punching portions of the upper mold punch 43a are opposite to the unnecessary portions of the molded article 21A. The mold punch unit 43 is vertically pressurized such that the upper mold punch 43a comes in contact with the lower mold punch 43b, thus cutting the unnecessary portions of the molded article 21A. As a result, individual semiconductor devices 21B are cut out from the molded article 21A containing a plurality of semiconductor chips 12. Thus, there can be executed, by one cutting operation, a processing of dividing the molded article 21A containing a plurality of semiconductor chips 12, into individual semiconductor devices 21B each containing one semiconductor chip 12. This results in reduction in lead time, further reducing the production cost.

The molded article 21A shown in FIG. 3(a) or FIG. 3(b), is a molded article obtained by using the removal block 32B having the largest thickness shown in FIG. 1(b). There are instances where burrs are formed at lateral sides of the encapsulated resin body 14 due to the shapes of corners of the cavity 31c of the lower mold 31b. Even in such a case, these burrs correspond to the unnecessary portions of the encapsulated resin body 14 and are therefore removed when the semiconductor devices 21B are cut out from the molded article 21A. Thus, no adverse effect is exerted onto the quality of the semiconductor devices 21B According to the first embodiment, the shaping step is subjected to the molded article 21A in which a plurality of semiconductor chips 12 are encapsulated. Therefore, the shaping step also serves as a dividing step of dividing the molded article 21A into individual semiconductor devices 21B each having one semiconductor chip 12. This eliminates the need for an independent dividing step.

(MODIFICATION 1 OF EMBODIMENT 1)

The following description will discuss a first modification of the first embodiment of the present invention with reference to attached drawings.

Figure 4:
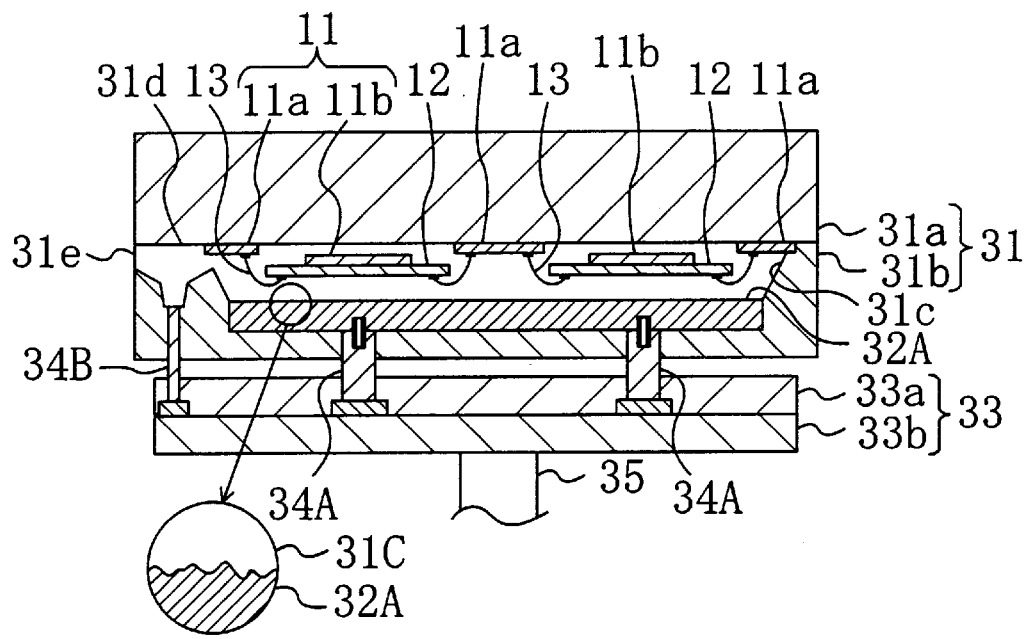
FIG. 4 is a partial structural section view of a resin encapsulating mold unit of resin-encapsulated semiconductor device producing apparatus according to a first modification of the first embodiment of the present invention.

FIG. 4 is a partial structural section view of a resin encapsulating mold unit of resin-encapsulated semiconductor device producing apparatus according to the first modification of the first embodiment of the present invention. In FIG. 4, like parts are designated by like reference numerals used in FIG. 1(a) and the description thereof is therefore omitted.

A partial enlarged illustration in FIG. 4 shows, in an enlarged manner, a portion of that surface of the removal block 32A projecting into the cavity 31c, and illustrates the surface state schematically. The surface state of the removal block 32A is transferred, as it is, to the encapsulating resin material injected into the cavity 31c at the encapsulating step. The surface state transferred to the encapsulating resin material greatly controls the marking condition under which a product No. and/or a secret No. of each semiconductor device are marked.

It is generally known that as the surface roughness is coarser, the resistance of the cavity 31c to the molded article at the mold release time is lowered.

Accordingly, to optimize the marking condition and the mold-release condition, it is conventionally required to adjust the surface state of the bottom of the cavity 31c of the encapsulating mold unit 31. According to the present invention, however, the removal block 32A is removably disposed. Thus, before fixed to the cavity 31c, the removal block 32A can be optimized for the surface state. Such optimization can much readily be executed than the adjustment of the surface state of the bottom of the cavity 31c. Further, the material of the lower mold 31b in which the cavity 31c is formed, is not always required to be the same as that of the removal block 32A. More specifically, there can be selected, independently from the material of the lower mold 31b, a material for the removal block 32A of which surface state can readily be adjusted and which can stand the resin encapsulating process. As a result, a resin-encapsulated semiconductor device of high quality can be produced with low cost.

(MODIFICATION 2 OF EMBODIMENT 1)

The following description will discuss a second modification of the first embodiment of the present invention with reference to attached drawings.

Figure 5:
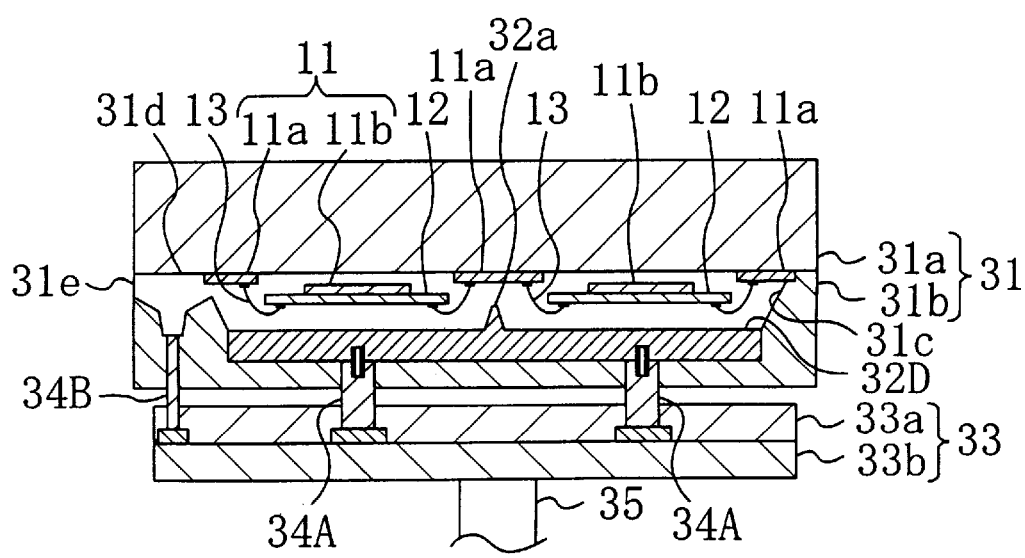
FIG. 5 is a partial structural section view of a resin encapsulating mold unit of resin-encapsulated semiconductor device producing apparatus according to a second modification of the first embodiment of the present invention.

FIG. 5 is a partial structural section view of a resin encapsulating mold unit of resin-encapsulated semiconductor device producing apparatus according to the second modification of the first embodiment of the present invention. In FIG. 5, like parts are designated by like reference numerals used in FIG. 1(a) and the description thereof is therefore omitted.

As shown in FIG. 5, the second modification is characterized in that a removal block 32D has a convex portion 32a at each position at which adjacent semiconductor chips 12 contained in one cavity 31c are to be partitioned.

This arrangement reduces the amount of the encapsulating resin material to be cut and removed at the shaping (dividing) step shown in FIG. 3(a) or FIG. 3(b). This not only shortens the cutting period of time, but also reduces the wear amount of either the dicing saw 42 blade or the punching portions of the mold punch unit 43.

Further, the cavity 31a is reduced in depth at the convex portion 32a of the removal block 32D. Accordingly, at the resin encapsulating step, the molten resin material flows more easily in the vicinity of the semiconductor chips 12 where the depth of the cavity 31c is deeper. This restrains the occurrence of defective filling-up in which the molten resin material is not injected perfectly and sufficiently up to the details. As a result, a resin-encapsulated semiconductor device of high quality can be produced.

According to this modification, the removal block 32D having the convex portion 32a is used. However, the removal block 32D may have other shaped portion dependent on applications. For example, a concave portion may be formed in the removal block 32D.

In each of the first embodiment, the first and second modifications thereof and other embodiments to be discussed later, there may be used, as the materials of the encapsulating mold unit 31 and the removal blocks 32A to 32F, powder-type cold-mold alloy tool steel equivalent to SKD and powder-type high-speed tool steel equivalent to SKH. Stainless steel may be used for the ejector plate unit 33, and SKH51 may be used for the ejector pin 34B and the like.

According to a first method of machining each of the removal blocks 32A to 32F with the use of any of the materials above-mentioned, the material of each of the removal blocks 32A to 32F may be subjected to an engraving electric discharge machining and then to blast machining using glass beads. According to a second method, the material of each of the removal blocks 32A to 32F may be subjected to a cutting machining and then to an embossing machining.

More specifically, the surface state of each of the removal blocks 32A to 32F may be adjusted and changed in the following manner. When the first machining method above-mentioned is adopted, there may be adjusted the electric spark intensity, the electric discharge period of time, and/or the surface state of the electrode itself at the electric discharge machining, or there may be adjusted the bead grain size, the bead spraying pressure, and/or the spraying period of time at the blast machining. When the second machining method above-mentioned is adopted, there may be adjusted the number of rotations of the tool, the feed speed, and/or the depth-of-cut amount at the cutting machining, or there may be adjusted the etching period of time, the concentration of the etching solution, and/or the solution spraying pressure at the embossing machining.

The convex portion 32a of the removal block 32D may be formed in the following manner. When the first machining method above-mentioned is adopted, a concave portion corresponding to the convex portion 32a may be formed in an electric spark electrode and an engraving electric discharge machining may be executed with the use of this electrode having the concave portion. When the second machining method above-mentioned is adopted, a cutting machining may be executed.

(EMBODIMENT 2)

The following description will discuss a second embodiment of the present invention with reference to attached drawings.

Figure 6:
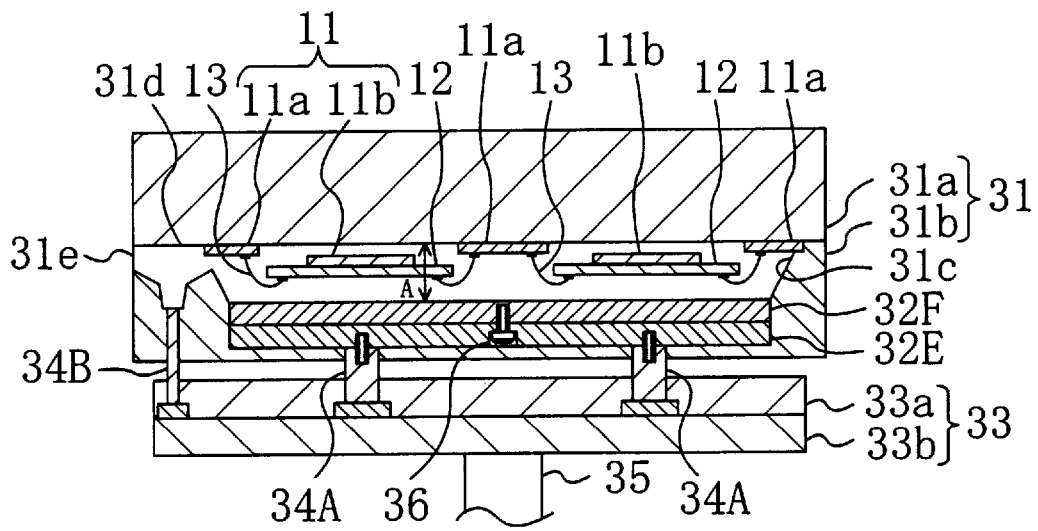
FIG. 6 is a partial structural section view of a resin encapsulating mold unit of resin-encapsulated semiconductor device producing apparatus according to a second embodiment of the present invention.

FIG. 6 is a partial structural section view of a resin encapsulating mold unit of resin-encapsulated semiconductor device producing apparatus according to the second embodiment of the present invention. In FIG. 6, like parts are designated by like reference numerals used in FIG. 1(a) and the description thereof is therefore omitted.

The second embodiment is characterized in that the lower mold 31b of the encapsulating mold unit 31 has a resin thickness regulating member comprising a laminated body in which two plate members are detachably laminated each other.

More specifically, as shown in FIG. 6, a first removal block 32E and a second removal block 32F are successively disposed, in this order, on the bottom of the cavity 31c of the lower mold 31b of the encapsulating mold unit 31, these blocks 32E and 32F being secured to each other with a connection bolt 36.

According to the second embodiment, too, the substantial depth A of the cavity 31c shown in FIG. 6 is changed when the thickness of the encapsulated resin body of a semiconductor device is changed. More specifically, in order that the substantial depth A becomes equal to the changed thickness of the encapsulated resin body, there is exchanged the removal block which does not come in direct contact with the encapsulating resin material, i.e., the first removal block 32E which is disposed at the position opposite to the semiconductor chips 12 with respect to the second removal block 32F.

According to the arrangement above-mentioned, the first removal block 32E is exchanged each time the thickness of the encapsulated resin body is changed. However, the second removal block 32F in direct contact with the encapsulating resin material is not exchanged. This does not change the state of that surface of the molded article which comes in contact with the second removal block 32F. Accordingly, even though semiconductor devices of different types are produced, the surface states of the encapsulated resin bodies of these semiconductor devices of different types can uniformly be controlled.

As to each first removal block 32E, the control of only the thickness is required and the control of the surface state is not required. This further reduces the production cost of resin-encapsulated semiconductor devices.

According to the second embodiment, the resin thickness regulating member is made in the two-layer structure. However, the resin thickness regulating member maybe made in the lamination structure of three or more layers.

(EMBODIMENT 3)

The following description will discuss a third embodiment of the present invention with reference to attached drawings.

Figure 7:
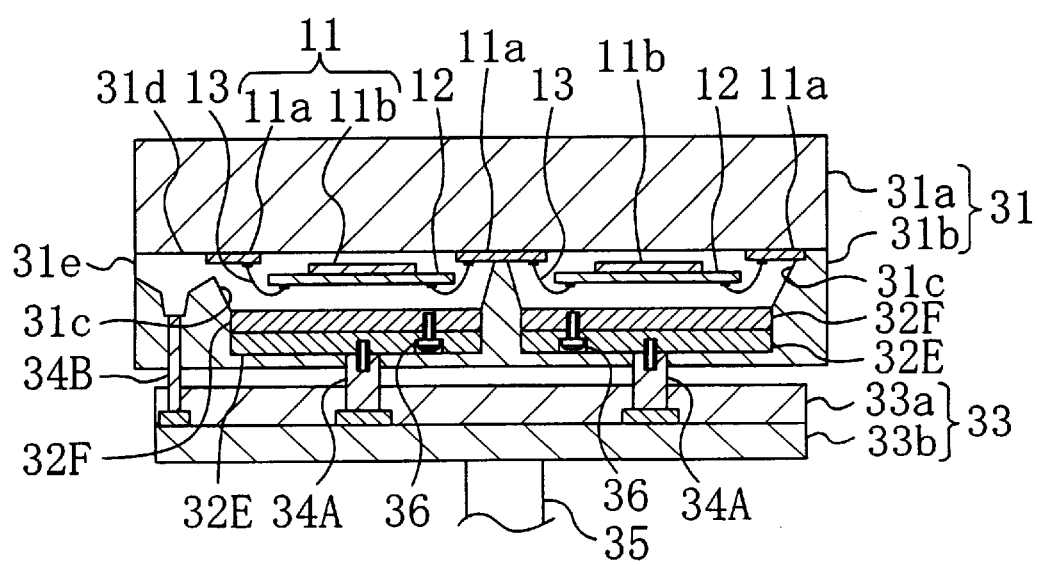
FIG. 7 is a partial structural section view of a resin encapsulating mold unit of resin-encapsulated semiconductor device producing apparatus according to a third embodiment of the present invention.

FIG. 7 is a partial structural section view of a resin encapsulating mold unit of resin-encapsulated semiconductor device producing apparatus according to the third embodiment of the present invention. In FIG. 7, like parts are designated by like reference numerals used in FIG. 6 and the description thereof is therefore omitted.

The third embodiment is characterized in that the lower mold 31b of the encapsulating mold unit 31 has cavities 31c in number equal to the number of semiconductor chips 12 bonded to the lead frame 11, and also has a resin thickness regulating member, for each cavity 31c, comprising a laminated body in which a plurality of members are detachably laminated.

According to the arrangement above-mentioned, when the thickness of the first removal block 32E in one cavity 31c is different from the thickness of the first removal block 32E in another cavity 31c, there can be produced, with the use of one encapsulating mold unit 31, a plurality of semiconductor devices having encapsulated resin bodies different in thickness from one another. This eliminates the need for a plurality of encapsulating mold units 31 having cavities 31c different in thickness from one another. Thus,resin-encapsulated semiconductor devices can economically be produced with shortened lead time.

In the third embodiment, the description has been made of the case where there are used, for the respective cavities 31c, first removal blocks 32E respectively different in thickness. However, the present invention is not limited to such an arrangement. It is now supposed that the first removal blocks 32E for the respective cavities 31c have the same thickness, and that the second removal blocks 32F for the respective cavities 31c have the same thickness. In this case, the thicknesses of the encapsulated resin bodies of a plurality of semiconductor devices can collectively be adjusted merely by changing all the thickness of a plurality of first removal blocks 32E.

There may be used, for the respective cavities 31c, second removal blocks 32F respectively different in thickness. In such a case, even though the first removal blocks 32E having the same thickness are used, there can be produced, with the use of one encapsulating mold unit 31, a plurality of semiconductor devices having encapsulated resin bodies different in thickness from one another.

One of resin-encapsulated semiconductor device producing apparatus according to the first embodiment, each modification thereof, the second embodiment and the third embodiment, may be selected in view of the production amount of semiconductor devices to be produced, the investment for the encapsulating mold unit of the production apparatus, and the like. Also, two or more of apparatus according to the first embodiment, each modification thereof, the second embodiment and the third embodiment, may be used in combination for the best efficiency.

(EMBODIMENT 4)

The following description will discuss a fourth embodiment of the present invention with reference to attached drawings.

Figure 8:
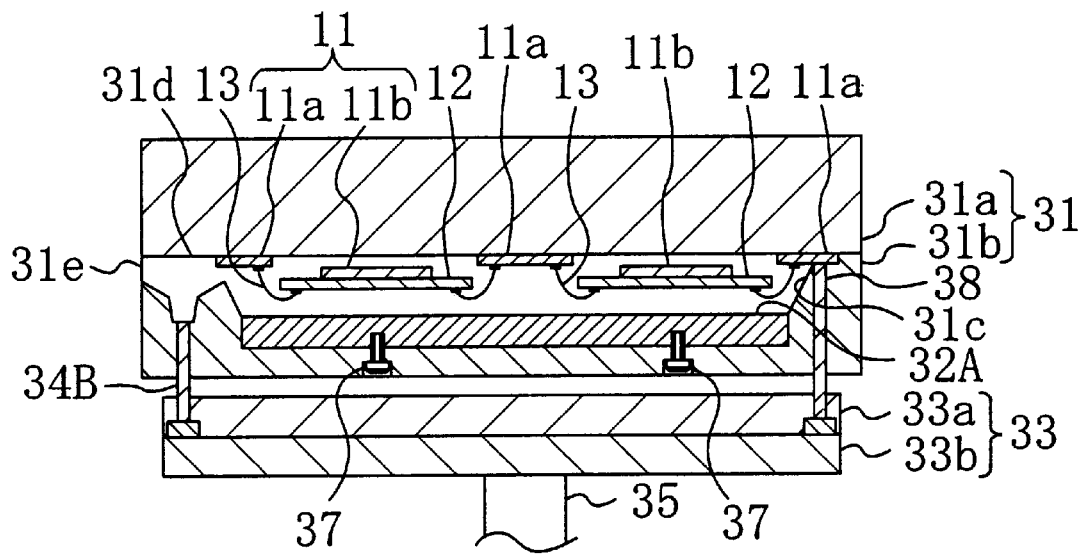
FIG. 8 is a partial structural section view of a resin encapsulating mold unit of resin-encapsulated semiconductor device producing apparatus according to a fourth embodiment of the present invention.

FIG. 8 is a partial structural section view of a resin encapsulating mold unit of resin-encapsulated semiconductor device producing apparatus according to the fourth embodiment of the present invention. In FIG. 8, like parts are designated by like reference numerals used in FIG. 1(a) and the description thereof is therefore omitted.

The fourth embodiment is characterized in that, as shown in FIG. 8, the removal block 32A is secured to the lower mold 31*b* of the encapsulating mold unit 31 with fixing bolts 37, and there is disposed a frame ejector pin 38 which comes in contact with the unnecessary portion of an inner lead portion 11*a* of the lead frame 11.

This arrangement eliminates the structure for vertically moving the removal block 32A. Further, there are disposed the frame ejector pin 38 for pushing out the unnecessary portion to be removed at the shaping (dividing) step after encapsulation, and the ejector pin 34B for pushing out the runner. Accordingly, at the time of mold release, no stress is exerted to the semiconductor elements in the semiconductor chips 12. This prevents the semiconductor elements from being damaged at the molded-article removing step.

There may be instances where that portion of the lead frame 11 which comes in contact with the ejector pin 34B, is damaged or where the encapsulating resin material comes off from the lead frame 11 in the vicinity of the contact portion above-mentioned. Even in such a case, no inconvenience occurs in the semiconductor devices because the contact portion will be removed at the shaping (dividing) step to be later executed.

Further, traces of the ejector pins are not left on the encapsulated resin body of semiconductor devices. This does not restrict the marking area of the encapsulated resin body. This results in increase in the degree of freedom for marking. Thus, resin-encapsulated semiconductor devices of high quality can be produced with low cost.

Resin encapsulation may be executed with the encapsulating mold unit having the cavities 31*c* without the removal blocks 32A disposed. In such a case, too, there can be produced the effect obtained by the arrangement in which the ejector pins do not come in direct contact with the semiconductor devices.

When a substrate is used instead of the lead frame 11, provision may be made such that the upper end of the frame ejector pin 38 at the encapsulating mold unit 31 side comes in contact with the unnecessary portion of the substrate.
(EMBODIMENT 5)

The following description will discuss a fifth embodiment of the present invention with reference to attached drawings.

Figure 9:
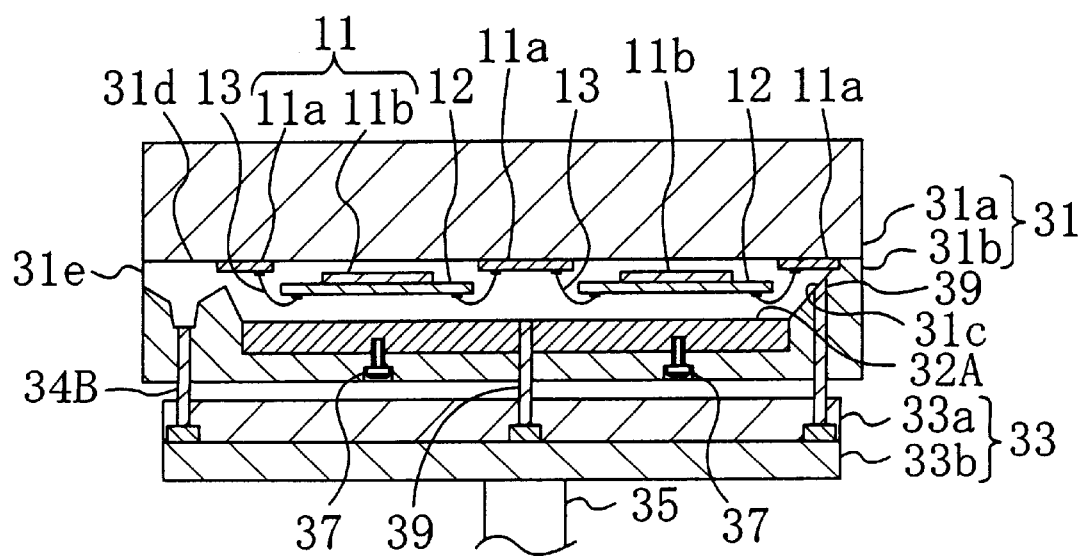
FIG. 9 is a partial structural section view of a resin encapsulating mold unit of resin-encapsulated semiconductor device producing apparatus according to a fifth embodiment of the present invention.

FIG. 9 is a partial structural section view of a resin encapsulating mold unit of resin-encapsulated semiconductor device producing apparatus according to the fifth embodiment of the present invention. In FIG. 9, like parts are designated by like reference numerals used in FIG. 8 and the description thereof is therefore omitted.

The fifth embodiment is characterized in that, as shown in FIG. 9, the removal block 32A is secured to the lower mold 31*b* of the encapsulating mold unit 31 with the fixing bolts 37, and there is disposed an unnecessary-resin ejector pin 39 which comes in contact with the unnecessary portion of the encapsulating resin material injected into the cavity 31*c*.

According to the arrangement above-mentioned, there are disposed the unnecessary-resin ejector pin 39 for pushing out the unnecessary portion to be removed at the shaping (dividing) step after encapsulation, and the ejector pin 34B for pushing out the runner. Accordingly, no traces of ejector pins are left on the encapsulated resin body of semiconductor devices after molding. This does not restrict the marking area of the encapsulated resin body. This results in increase in the degree of freedom for marking. Thus, resin-encapsulated semiconductor devices of high quality can be produced with low cost.

Resin encapsulation may be executed with the encapsulating mold unit having the cavities 31*c* without the removal blocks 32A disposed. In such a case, too, there can be produced the effect obtained by the arrangement in which the ejector pins do not come in direct contact with semiconductor devices.

In each of the first embodiment, its modifications, and the second to fifth embodiments, the lead frame 11 is used as a member for holding semiconductor chips 12. However, even though a substrate is used as the semiconductor chips 12 holding member, similar effects may also be produced.

What is claimed is:

1. A resin-encapsulated semiconductor device producing apparatus comprising:

resin encapsulating means for encapsulating, into a unitary structure, a semiconductor-chip holding zone of a lead frame or a substrate which holds a semiconductor chip, such encapsulation being made with an encapsulating resin material, said resin encapsulating means comprising first and second holding members for holding said lead frame or said substrate such that said first and second holding members are opposite to each other through said lead frame or said substrate, at least one of said first and second holding members having a housing concave formed opposite to said holding zone, said housing concave being capable of housing said encapsulating resin material, and a resin thickness regulating member for regulating the thickness of said encapsulating resin material being removably disposed on the bottom of said housing concave.

2. A resin-encapsulated semiconductor device producing apparatus according to claim 1, wherein said resin thickness regulating member comprises a single plate member.

3. A resin-encapsulated semiconductor device producing apparatus according to claim 1, wherein said resin thickness regulating member comprises a laminated body in which a plurality of plate members are detachably laminated.

4. A resin-encapsulated semiconductor device producing apparatus according to claim 1, wherein said lead frame or said substrate holds a plurality of semiconductor chips, and both said housing concave and said resin thickness regulating member are disposed for each of said semiconductor chips.

5. A resin-encapsulated semiconductor device producing apparatus according to claim 1, wherein said lead frame or said substrate holds a plurality of semiconductor chips, and said housing concave is disposed so as to house said semiconductor chips.

6. A resin-encapsulated semiconductor device producing method comprising:

a die bonding step of getting a semiconductor chip held by a lead frame or a substrate at its predetermined zone; and a resin encapsulating step of (i) holding said lead frame or said substrate in a resin encapsulating mold unit having a housing concave capable of housing an encapsulating resin material, such that said semiconductor chip is opposite to said housing concave, (ii) then injecting an encapsulating resin material into said housing concave and (iii) encapsulating said semiconductor chip with said injected encapsulating resin material, said resin encapsulating step having a step of conducting a resin encapsulation with the use of a resin thickness regulating member which is removably disposed on the bottom of said housing concave such that the thickness of said injected encapsulating resin material is regulated.

7. A resin-encapsulated semiconductor device producing method according to claim 6, wherein said resin encapsulating step comprises a step of regulating the state of that surface of said resin thickness regulating member which comes in contact with an encapsulating resin material which is injected.

8. A resin-encapsulated semiconductor device producing method according to claim 6, wherein said resin encapsulating step comprises a step of regulating the shape of that surf ace of said resin thickness regulating member which comes in contact with an encapsulating resin material which is injected.

9. A resin-encapsulated semiconductor device producing method according to claim 6, further comprising, after said resin encapsulating step, a step of (i) hardening said encapsulating resin material which encapsulates said semiconductor chip, and (ii) then moving said resin thickness regulating member in the opening direction of said housing concave, thereby to take out the hardened encapsulating resin material from said housing concave.

10. A resin-encapsulated semiconductor device producing method according to claim 6, further comprising, after said resin encapsulating step, a step of (i) hardening said encapsulating resin material which encapsulates said semiconductor chip, (ii) then applying a pressure to that unnecessary portion of said lead frame or said substrate which projects from the hardened encapsulating resin material, said pressure being applied in the opening direction of said housing concave, and (iii) moving said hardened encapsulating resin material in the opening direction of said housing concave, thereby to take out said hardened encapsulating resin material from said housing concave.

11. A resin-encapsulated semiconductor device producing method according to claim 6, further comprising, after said resin encapsulating step, a step of (i) hardening said encapsulating resin material which encapsulates said semiconductor chip, (ii) then applying a pressure to the unnecessary portion of the hardened encapsulating resin material in the opening direction of said housing concave, and (iii) moving said hardened encapsulating resin material in the opening direction of said housing concave, thereby to take out said hardened encapsulating resin material from said housing concave.

12. A resin-encapsulated semiconductor device producing method according to claim 6, further comprising, after said resin encapsulating step, a shaping step of (i) hardening said encapsulating resin material which encapsulates said semiconductor chip, and (ii) then removing the unnecessary portion of the hardened encapsulating resin material, thereby to arrange the shape of said hardened encapsulating resin material.

13. A resin-encapsulated semiconductor device producing method according to claim 12, wherein said shaping step comprises a step of cutting, with a dicing saw, the boundary between the necessary portion and the unnecessary portion of said hardened encapsulating resin material.

14. A resin-encapsulated semiconductor device producing method according to claim 12, wherein said shaping step comprises a step of cutting, with a mold punch unit, the boundary between the necessary portion and the unnecessary portion of said hardened encapsulating resin material.

15. A resin-encapsulated semiconductor device producing method comprising:

a die bonding step of getting a semiconductor chip held by a lead frame or a substrate at its predetermined zone;

a resin encapsulating step of (i) holding said lead frame or said substrate in a resin encapsulating mold unit having a housing concave capable of housing an encapsulating resin material, such that said semiconductor chip is opposite to said housing concave, (ii) then injecting an encapsulating resin material into said housing concave and (iii) encapsulating said semiconductor chip with said injected encapsulating resin material; and a step of (i) hardening said encapsulating resin material which encapsulates said semiconductor chip, (ii) then applying a pressure to that unnecessary portion of said lead frame or said substrate which projects from the hardened encapsulating resin material, said pressure being applied in the opening direction of said housing concave, and (iii) moving said hardened encapsulating resin material in the opening direction of said housing concave, thereby to take out said hardened encapsulating resin material from said housing concave.

16. A resin-encapsulated semiconductor device producing method comprising:

a die bonding step of getting a semiconductor chip held by a lead frame or a substrate at its predetermined zone;

a resin encapsulating step of (i) holding said lead frame or said substrate in a resin encapsulating mold unit having a housing concave capable of housing an encapsulating resin material, such that said semiconductor chip is opposite to said housing concave, (ii) then injecting an encapsulating resin material into said housing concave and (iii) encapsulating said semiconductor chip with said injected encapsulating resin material; and a step of (i) hardening said encapsulating resin material which encapsulates said semiconductor chip, (ii) then applying a pressure to the unnecessary portion of the hardened encapsulating resin material in the opening direction of said housing concave, and (iii) moving said hardened encapsulating resin material in the opening direction of said housing concave, thereby to take out said hardened encapsulating resin material from said housing concave.

* * * * *